US011258411B2

(12) United States Patent
Putzeys et al.

(10) Patent No.: US 11,258,411 B2
(45) Date of Patent: Feb. 22, 2022

(54) AMPLIFIER WITH AN AT LEAST SECOND ORDER FILTER IN THE CONTROL LOOP

(71) Applicant: PURIFI APS, Hojbjerg (DK)

(72) Inventors: Bruno Putzeys, Achel (BE); Lars Risbo, Hvalso (DK)

(73) Assignee: PURIFI APS, Hojbjerg (DK)

( * ) Notice: Subject to any disclaimer, the term of this patent is extended or adjusted under 35 U.S.C. 154(b) by 0 days.

(21) Appl. No.: 16/770,319

(22) PCT Filed: Jul. 20, 2018

(86) PCT No.: PCT/EP2018/069758
§ 371 (c)(1),
(2) Date: Jun. 5, 2020

(87) PCT Pub. No.: WO2019/110153
PCT Pub. Date: Jun. 13, 2019

(65) Prior Publication Data
US 2020/0382084 A1 Dec. 3, 2020

(30) Foreign Application Priority Data

Dec. 7, 2017 (EP) .................................... 17205939

(51) Int. Cl.
*H03F 3/217* (2006.01)
*H03F 3/38* (2006.01)

(52) U.S. Cl.
CPC ....... *H03F 3/2171* (2013.01); *H03F 2200/03* (2013.01); *H03F 2200/129* (2013.01); *H03F 2200/168* (2013.01); *H03F 2200/462* (2013.01); *H03F 2200/66* (2013.01); *H03F 2200/78* (2013.01)

(58) Field of Classification Search
CPC .............. H03F 3/2171; H03F 2200/03; H03F 2200/129; H03F 2200/168; H03F 2200/462; H03F 2200/66; H03F 2200/78; H03F 3/181
USPC ...................................... 330/10, 207 A, 251
See application file for complete search history.

(56) References Cited

U.S. PATENT DOCUMENTS

| | | | |
|---|---|---|---|
| 3,638,210 A | 1/1972 | Hankins et al. |
| 4,041,411 A | 8/1977 | Sturgeon |
| 5,459,438 A | 10/1995 | Mirow |
| 6,297,692 B1 | 10/2001 | Nielsen |
| 7,113,038 B2 | 9/2006 | Putzeys |
| 7,142,050 B2 | 11/2006 | Risbo |
| 7,852,150 B1 | 12/2010 | Arknaes-Pedersen |

(Continued)

FOREIGN PATENT DOCUMENTS

| | | |
|---|---|---|
| EP | 1770855 A1 | 4/2007 |
| GB | 2439983 A | 1/2008 |

(Continued)

OTHER PUBLICATIONS

International Search Report and Written Opinion from PCT Application No. PCT/EP2018/069758, dated Sep. 18, 2018.

(Continued)

*Primary Examiner* — Hieu P Nguyen
(74) *Attorney, Agent, or Firm* — Workman Nydegger

(57) ABSTRACT

A Class D amplifier having an integrating primary amplifier with an internal feedback, the amplifier further comprising a feedback loop with a filter of at least second order.

11 Claims, 7 Drawing Sheets

(56) References Cited

U.S. PATENT DOCUMENTS

| | | |
|---|---|---|
| 8,049,557 B2 | 11/2011 | Putzeys |
| 8,497,746 B2 | 7/2013 | Visconti et al. |
| 8,736,367 B2 | 5/2014 | Bostrom |
| 10,778,160 B2 * | 9/2020 | Butler .................. H03F 3/245 |
| 2001/0030529 A1 | 10/2001 | Stanley |
| 2005/0017799 A1 | 1/2005 | Risbo et al. |
| 2006/0008095 A1 | 1/2006 | Tsuji |
| 2007/0009812 A1 | 1/2007 | Ito et al. |
| 2007/0052478 A1 | 3/2007 | Candy |
| 2007/0057721 A1 | 3/2007 | Risbo et al. |
| 2007/0096812 A1 | 5/2007 | Lee |
| 2008/0180278 A1 | 7/2008 | Denison |
| 2010/0073063 A1 | 3/2010 | Lakshmikumar et al. |
| 2013/0057331 A1 | 3/2013 | Yuan et al. |
| 2015/0214902 A1 | 7/2015 | Lin |
| 2016/0352293 A1 | 12/2016 | Bostrom |
| 2017/0230019 A1 | 8/2017 | Chandrakumar et al. |

FOREIGN PATENT DOCUMENTS

| | | |
|---|---|---|
| JP | 2001503575 A | 3/2001 |
| WO | 01/71905 A2 | 9/2001 |
| WO | 2005/002050 A1 | 1/2005 |
| WO | 2007/099442 A1 | 9/2007 |
| WO | 2013/164229 A1 | 11/2013 |
| WO | 2016091620 A1 | 6/2016 |

OTHER PUBLICATIONS

Extended European Search Report from EP Application No. 17205939.6, dated Feb. 21, 2018.
Nelson Pass, "Phase Coherent Crossover Networks", Aug. 2, 1998, 6 pages, retrieved from the Internet on May 31, 2018 from: URL:https://www.passlabs.com/sites/default/files/phasecrx.pdf.
Office Action from corresponding EP application No. 18740251.6, dated Apr. 21, 2021.

* cited by examiner

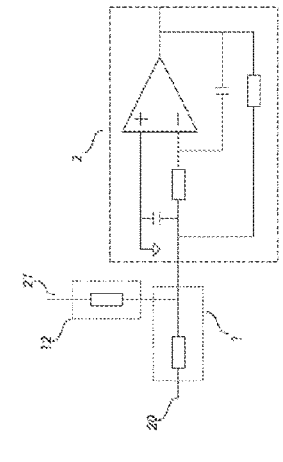
Figure 7
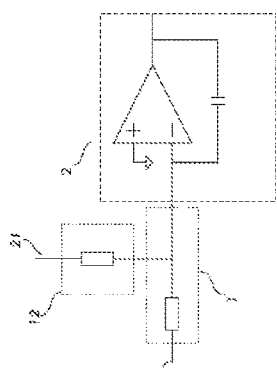
Figure 6
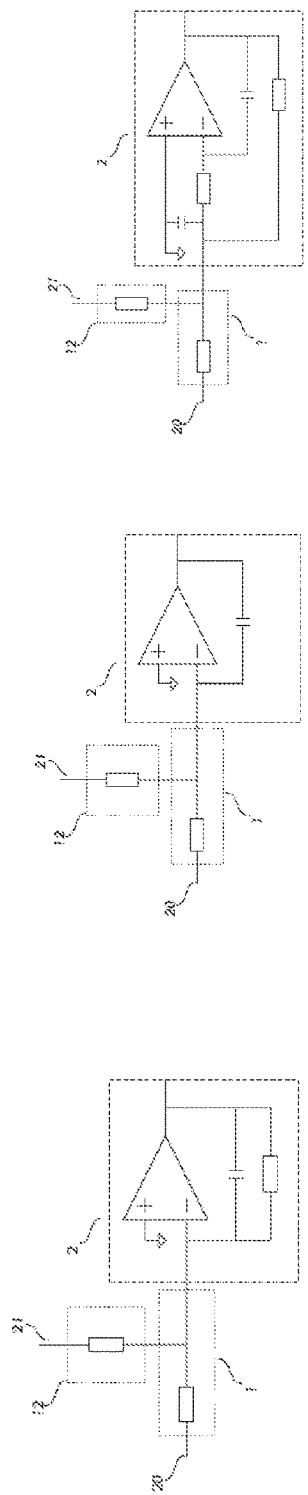
Figure 5
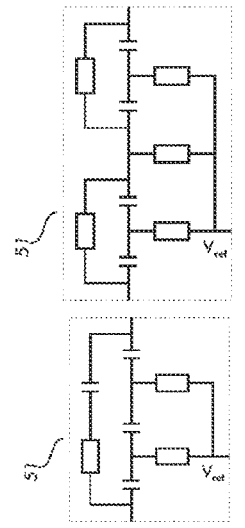
Figure 14
Figure 13
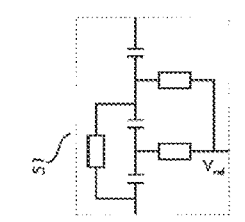
Figure 12
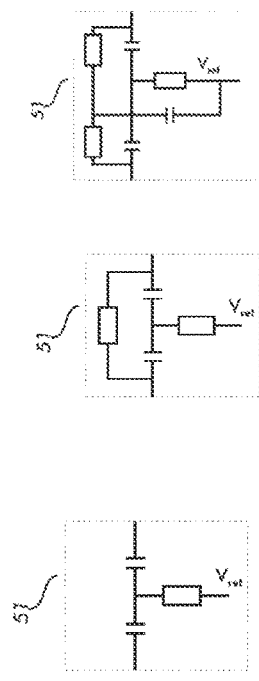
Figure 11
Figure 10
Figure 9
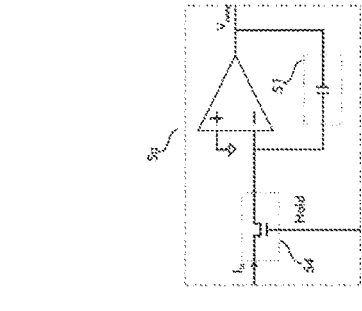
Figure 19
Figure 18
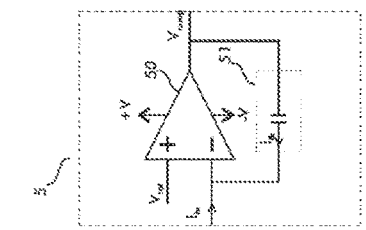
Figure 17
Figure 16
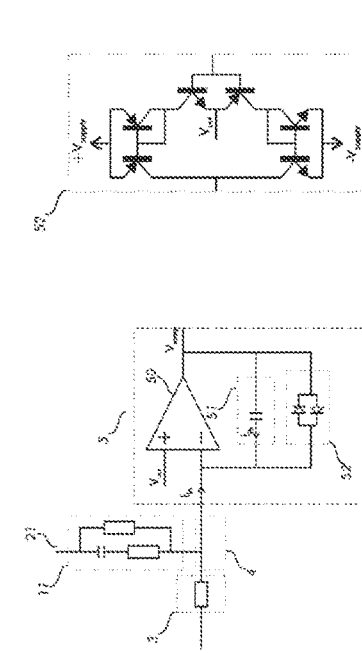
Figure 8

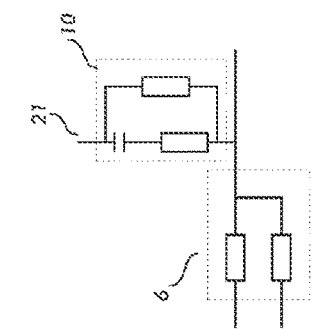
Figure 23
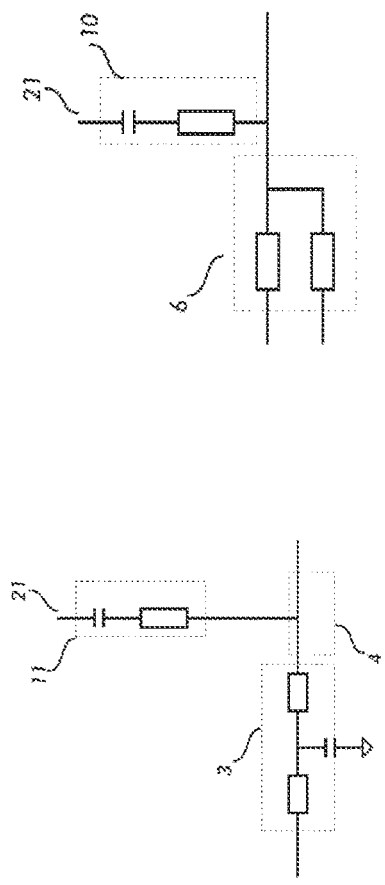
Figure 22
Figure 21
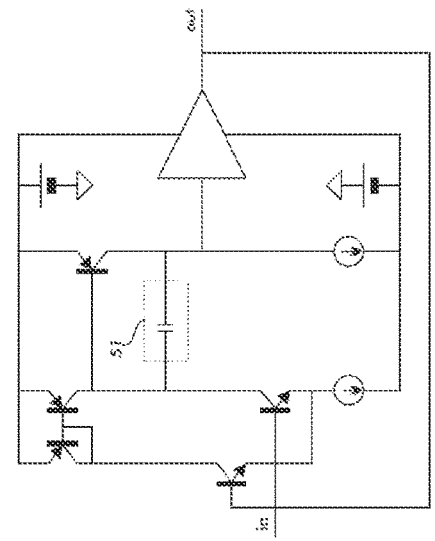
Figure 24
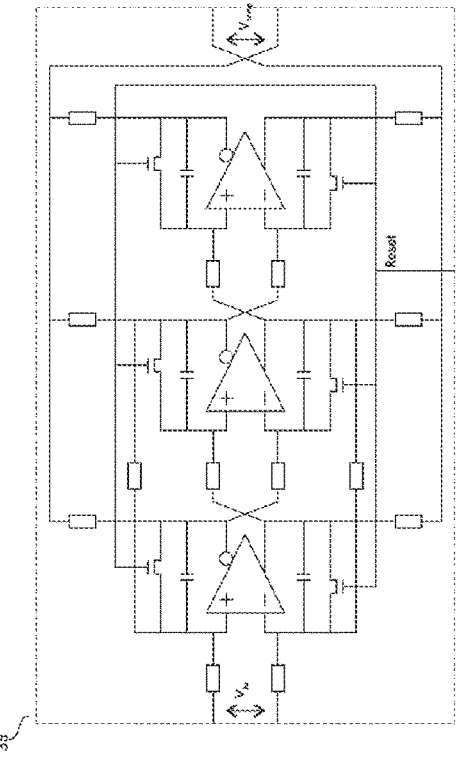
Figure 20

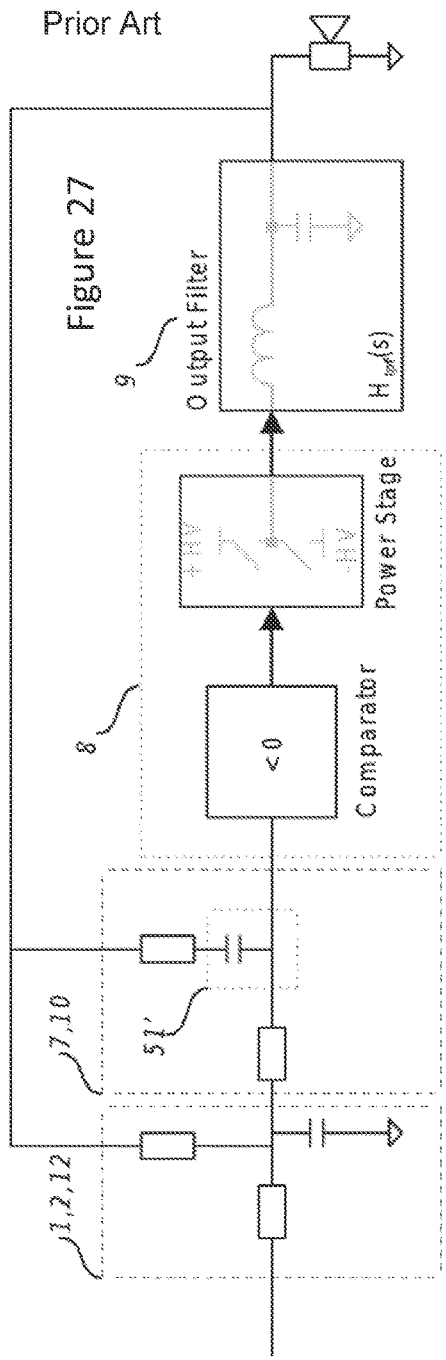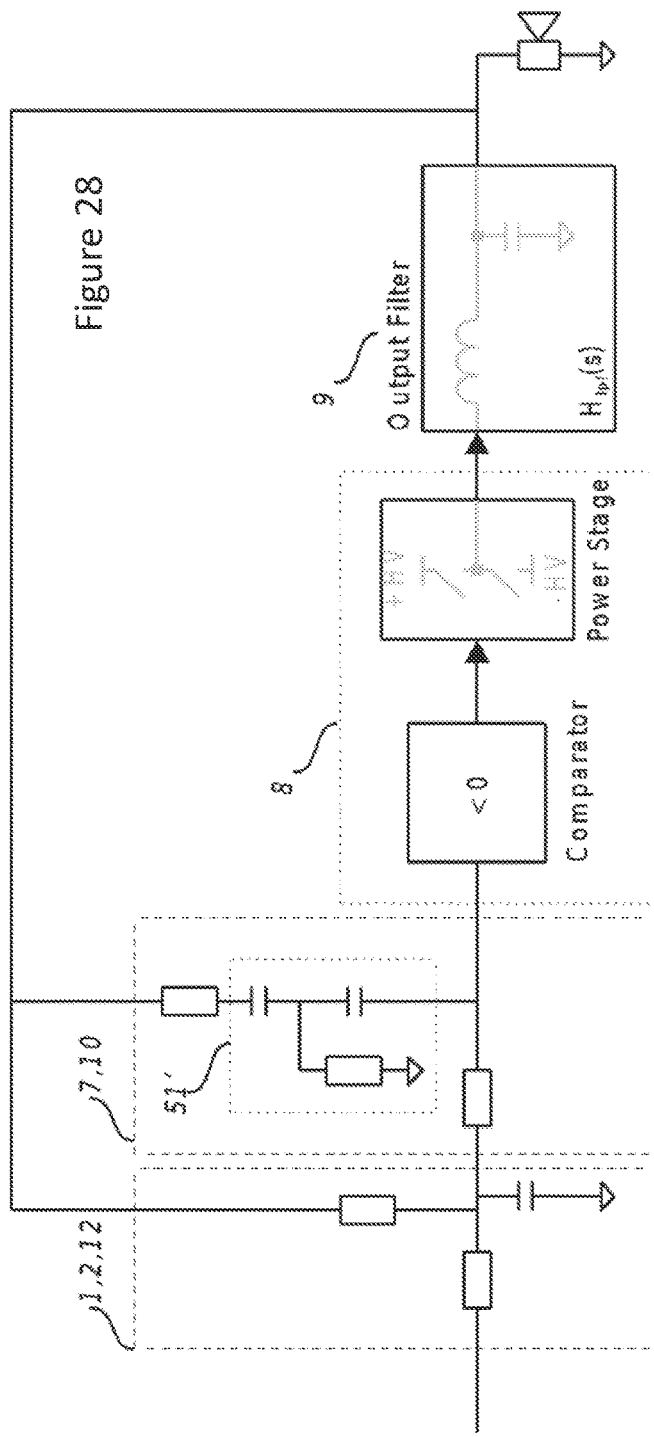

AMPLIFIER WITH AN AT LEAST SECOND ORDER FILTER IN THE CONTROL LOOP

BACKGROUND AND SUMMARY

The present invention relates to an amplifier with a filter in the control loop, and more particularly a Class D amplifier where the filter is of at least second order.

Amplifiers and relevant technology may be seen in U.S. Pat. Nos. 4,041,411, 7,142,050, 8,049,557, 8,736,367, US2010/073063, US2001/030529, US2007/09812, WO01/71905, and US2016/0352293.

In a first aspect, the invention relates to an amplifier comprising:
 an input,
 an output,
 a primary amplifier having a primary amplifier input, a primary amplifier output, a comparator, a switching power stage controlled by the comparator, and a feedback network connected between the output and an input of the comparator, the feedback network forming at least substantially a high pass filter, and the primary amplifier being configured to have a frequency response at least substantially as that of an integrator, and
 a first control circuit comprising:
  a first control input operatively connected to the input,
  a second control input operatively connected to the primary amplifier output,
  a control output operatively connected to the primary amplifier input and to the first control input, and
  a filter of at least second order between the second control input and the control output.

In the present context, an amplifier is an element configured to receive a signal, such as an audio signal, and output a corresponding signal, preferably with a higher signal amplitude. Often, an audio amplifier receives an electrical audio signal of a low signal strength (voltage) and outputs a corresponding signal with a higher signal strength. In this context, two signals correspond if they have the same spectral contents in at least a frequency interval.

It is noted that an amplifier may be used for amplifying other types of signals than audio signals. An amplifier may be used as a power supply or controller feeding e.g. a linear actuator so as to drive the actuator in a controlled manner. In this situation, the amplifier may receive a lower amplitude signal corresponding to what is desired to be fed to the actuator, where the amplifier will output a current or voltage adapted to the requirements of the actuator.

An integrating amplifier, in the present context, is an amplifier which acts substantially like an integrator. That is to say that over a significant portion (such as at least 30%) of the range between 20 Hz and 20 kHz the gain at a first frequency is higher than the gain at a second frequency which is twice the first frequency. Preferably the gain at the first frequency is at least 1.5 times the gain at the second frequency.

In this context, an input is a portion of a circuit, for example, configured to receive a signal. In many situations, an input is a conductor, such as a conductor of an electrical element, a chip/ASIC or the like. An input may comprise a connector, such as if the input is an input to the amplifier proper (such as from outside of an amplifier casing and/or from a pre-amplifier). Then, a signal source may be detachably connected to the input to deliver a signal to the input. Alternatively, an input may be an input into a portion of the amplifier, where detachability is not desired, so that the input may be a permanent connection. Permanent connections may be obtained via e.g. a conductor, a solder pad or the like to which another element may be permanently connected, such as by soldering, in order to deliver a signal to the input. Naturally, the input may be an internal portion, such as a conductor, of a chip or the like, between portions of the chip.

An output, as the input, may be an output to the surroundings of the amplifier, so that the output may comprise a connector for detachable attachment to e.g. a load, a cable or the like. Alternatively, an output may be an output from one component of the amplifier to another component. If such components are not desired detachable, the output may be permanently connected thereto. In permanently connected situations, an output may be a conductor, leg or the like, where one end of the conductor may be an input and the other end an output.

Often, the primary amplifier output is also the output of the amplifier proper, such as if the outputs share the same conductor(s). It may be desired, however, to connect further circuits, such as filters, between these outputs, after the amplifier output or simply to the outputs. Usually, a low pass filter, such as an LC filter, often called an output filter, is connected to the output to remove high frequency noise stemming from the operation of the primary amplifier, so that this noise is not carried on to a load connected to the output. This filter may be provided inside the primary amplifier, after the switching power stage and form the output of the primary amplifier. It is noted that the outputs may share a connector to which one port of a filter is connected.

A primary amplifier is an amplifier in itself. Thus, it may behave as the above-described amplifier. However, the primary amplifier may be desired to, or allowed to, have other parameters or another behaviour than that/those of the overall amplifier. For example, even though self-oscillation in itself may not be a requirement to the overall amplifier, the primary amplifier may be configured to be self oscillating, such as if the control circuit is configured to control the primary amplifier away from oscillation or in a manner so that this oscillation is desirable.

The primary amplifier has a primary amplifier input and a primary amplifier output which may be as the input and output described above. It is noted that it is not usually desired to be able to detach the primary amplifier from the paths mentioned below, so that the primary amplifier input/output may be formed by conductors or the like on e.g. a PCB, within a circuit, between circuits or the like.

The primary amplifier comprises an amplifier gain stage comprising a comparator and a switching power stage controlled by the comparator. Amplifiers of this type usually are called Class D amplifiers. Normally, the primary amplifier input is connected to or constituted by an input to the comparator. A Class D amplifier may be self oscillating or have an oscillating frequency imposed on it.

In this context, a power stage is a circuit that controls current flow from a power supply to a load in response to a control signal. In this context, a switching power stage is a power stage in which all power devices are operated either fully on or fully off for substantially all of the time. Power devices may be transistors, FETs, IGBTs and the like.

The primary amplifier comprises a first feedback network connected between the primary amplifier output and an input of the comparator and/or the input to the primary amplifier, the feedback network forming at least substantially a high pass filter. The first feedback network, together with the amplifier gain stage forms an internal feedback loop.

The frequency response of the primary amplifier becomes substantially inversely proportional to the frequency response of the first feedback filter. Thus, if the first feedback filter is configured to be a high pass filter with suitable parameters, the primary amplifier will act substantially like an integrator as described above. Then, this high pass filter may, over a significant portion (such as at least 30%) of the range between 20 Hz and 20 kHz, have a gain at a first frequency is lower than the gain at a second frequency which is twice the first frequency. Preferably the gain at the second frequency is at least 1.5 times the gain at the first frequency. Preferably, the high pass filter has a first order slope over at least 50% of the audio band of 20 Hz-20 kHz, such as above 5 kHz.

In this context, a high pass filter is a filter whose gain exhibits an upward trend over at least a desired frequency interval. In the present context, the desired frequency interval is between a quarter and one half of the idle switching frequency, such as between 10 kHz and half the idle switching frequency or between 5 kHz and half the idle switching frequency, wherein the gain is higher (lower attenuation) at higher frequencies and lower (higher attenuation) at the lower frequencies.

This internal feedback filter may have any order. In legacy Class D amplifiers, this filter is a first order filter, but it may be advantageous that this filter is of at least second order as it has the potential to increase the loop gain, at least at lower frequencies, in any assembly in which the primary amplifier may be embedded.

Also, a comparator normally, in Class D amplifiers, is a circuit that outputs a binary signal corresponding to the sign of the difference between two input signals, or between an input signal and a predetermined voltage.

In this context, the output signal of the comparator acts as the control signal to the switching power stage.

The first control circuit has a first and a second control input and a control output. These inputs and outputs may be as described above. It is noted that it is usually not desired to be able to detach the first control circuit from the input, the output and the primary amplifier input, so that the first control circuit inputs/output may be formed by conductors or the like on e.g. a PCB, within a circuit, between circuits or the like.

That an input is operatively connected to an input or an output, in the present context, means that a signal may be fed from the input/output to the first/second control input. This signal may, however, be filtered, amplified, attenuated or a combination thereof along the path between said input and said output.

One manner of operatively connecting e.g. the first control input to the input is to provide a forward path from the first control input to the input. This forward path may be a simple conductor. Alternatively, the path may comprise filters, attenuators, amplifiers or the like. In fact, the path may also comprise e.g. a summing node configured to receive the signal (filtered or the like if desired) from the input and another signal and to output a sum of these signals to a remainder of the path until reaching the first control input.

The first control input is also operatively connected to the control output. Clearly, a signal received at the first control input may also be filtered, such as by the $2^{nd}$ order filter or a part thereof. Usually, the signal received on the first control input and that received on the second control input will be combined, in addition to any processing performed on the signals or the combination, before being output on the control output.

Naturally, the same applies for a feedback path provided between the second control input and the output.

Also, a path may be defined between the control output and the primary amplifier input.

It is noted that the forward path and the feedback path may have common elements, such as the filter or a portion thereof, and separate elements. Thus, a portion of the feedback path not common with the forward path may comprise the filter or a portion thereof. Thus, the filter may be provided only between the second control input and the control output so as to filter signals received on the second control input before outputting on the control output. Then, signals received on the first control input will not be filtered by the filter. Alternatively, the filter may be provided so that it—or a portion thereof—filters also a signal received from the first control input.

This filter of at least second order is provided in a feedback set-up between the primary amplifier output and the primary amplifier input. In usual Class D amplifiers, a filter is provided in this position but only of the first order.

Providing a second or higher order filter between the second control input and the control output has the advantage of increasing loop gain, at least at low frequencies.

A first filter which is of at least first order may be provided between the second control input and the control output while another, second filter of at least first order may be provided in a path common to the path between the first control input and the control output and the path between the second control input and the control output. Said second filter increases loop gain, at least at low frequencies, while said first filter may be e.g. substantially a high pass filter whose response is chosen such that at least while the primary amplifier is operating in the first operating mode, the signal level at the control output is minimised.

Thus, between the second control input and the control output, a combined filter of at least second order is found.

The frequency response of said first filter may be chosen to be substantially the inverse of the frequency response of the primary amplifier. Alternatively, a third filter may be provided between the first control input and the control output which is not common with the path between the second control input and the control output. The ratio between the frequency responses of said second and third filters may be chosen to be substantially equal to the frequency response of the primary amplifier.

The control circuit may comprise what is usually called a compensator, which is a circuit provided both in a feedback around the primary amplifier as well as in a forward path between the amplifier input and the primary amplifier input. Naturally the control circuit may comprise a portion which is in the feedback path and not in the forward path.

In one embodiment, the amplifier further comprises a third path from the output to an input of the compensator. This path, together with a path from the amplifier input, allows the compensator to generate an additional input signal to the primary amplifier based on an error signal derived from the signals supplied through the paths from the output and the input to the input of the compensator. By filtering and amplifying the error signal the compensator will produce a signal that counteracts the distortion generated by the primary amplifier, at least within a desired frequency band.

In a preferred embodiment, the first control circuit is configured to have a ratio between:
  a first transfer function from the second control input to the control output and a second transfer function from the first control input to the control output at least substantially corresponds to the transfer function of an integrator over at least a frequency decade.

In the present context, a transfer function describes the behaviour of a system by the ratio between the output signal and the input signal, as a function of frequency, where the magnitude of the transfer function expresses the ratio between the magnitudes of the output signal and the input signal and the argument of the transfer function expresses the phase shift between the output signal and the input signal. Often, the transfer function is seen as the relative attenuation or amplification at different frequencies at least within a frequency interval of interest. Presently, the first control circuit has the integrating behaviour within at least a decade of frequencies. A decade of frequencies ranges from frequency X to frequency 10*X. preferably, however, the integrating behaviour is desired even within a broader frequency range such as over a factor of 15, 20, 50 or more, for instance in the range of 2 kHz-20 kHz or 1 kHz-40 kHz.

The ratio between two transfer functions may be derived by characterising both and dividing one by the other.

As mentioned above, the filter may be provided at different positions within the first control circuit and may thus affect the first transfer function alone or both the first and second transfer functions.

In the present context, the transfer function of an integrator has a downward slope over at least a decade.

In one embodiment, the primary amplifier is configured to operate in one of at least a first and a second amplifier operating mode, and wherein the first control circuit comprises a compensator that is configured to have its operation disabled when the primary amplifier is operating in the second operating mode.

One amplifier operating mode may be a mode wherein the primary amplifier has a particular frequency response, a particular gain, switching frequency in a particular range or the like. Often, the first amplifier mode is the desired operating mode, where the second amplifier mode is a mode which is not preferred but which may not be completely avoidable in the primary amplifier. A typical second amplifier mode is a clipping mode where the primary amplifier produces an output voltage substantially limited by the power supply voltages, stops switching or switches at a frequency outside the range of the first mode. Another second amplifier mode could be the so-called "current clipping" where a protection circuit overrides the comparator and takes control of the power state to limit the output current. When operating in clipping mode, the primary amplifier may have only a negligible response to changes in the primary amplifier input signal. The second mode may be when the primary amplifier is not in the first mode.

Thus, the first amplifier mode may be characterized as a mode wherein the additional change in the primary amplifier output signal in response to an additional small change in the primary amplifier input signal is substantially the same as the response of the primary amplifier output signal to a signal consisting of only that additional change in the primary amplifier input signal. Thus, in the first mode, the primary amplifier may provide the input signal with the desired gain. That is to say, when the presence of a large signal has not materially impacted the ability of the primary amplifier to respond to an additional small signal.

A third mode may be where the primary amplifier protects itself against a potentially damaging load condition. It may do so, for instance, by turning off temporarily.

A fourth mode may be where the primary amplifier is turned off. This may be as part of a power up/down sequence or a result of a command by the user.

In the present context, a control circuit is a circuit which, by virtue of the operative connections, is connected in a feed-back loop between the input and output of the primary amplifier. The control circuit may be a filter, of any order, which may be implemented in any desired manner. The overall function of the control circuit preferably is to regulate the output of the primary amplifier more closely to its desired value. The control circuit preferably comprises a compensator which filters an error signal found by comparing a signal derived from an input to a signal derived from the primary amplifier output, in such a way that in a first frequency range the compensator amplifies the error signal and in a second frequency range the compensator does not amplify the error signal and may even attenuate it. The compensator may be embodied as a low pass filter of any order, or as one or more integrators. The first frequency range corresponds to the desired frequency band of operation. In an audio amplifier this bandwidth could be e.g. to 0 Hz-40 kHz, 0 Hz-20 kHz, or 20 Hz-20 kHz. The second frequency range could be a band outside the first band e.g. 60 kHz-1 MHz, 100 kHz-700 kHz. In the case of a class D amplifier, the second frequency range typically includes the switching frequency.

The compensator usually is provided in a feedback loop from the primary amplifier output to the primary amplifier input as well as in a forward path from the input of the amplifier proper to the primary amplifier input. Consequently, the compensator may take the place of the filter of at least second order. Alternatively, the compensator may form part of this filter which, in addition to the compensator, has another portion, which may then not be provided in the forward path. The combined filtering or transfer function of this feedback path thus has a filter of at least second order.

The compensator is configured to have its operation is disabled when the primary amplifier is operating at least in the second amplifier operating mode. This disabling may be embodied in any desired manner and may render the compensator out of operation in a number of manners. In one situation, the compensator may, when disabled, prevent transfer of signals along a path in which it is provided, thus effectively preventing signal transport from the amplifier input to the primary amplifier input along that path. In this situation, another forward path is preferably provided so that a signal may still be fed from the input to the primary amplifier input via that path. Alternatives to this set-up are described further below.

In another situation, the disabling may be obtained by rendering the compensator "invisible", such as by providing the compensator with no frequency filtering capabilities, such as when it has a predetermined gain, such as unity gain, over a frequency interval of interest (such as 0 Hz-100 kHz). Then, the disabled compensator will allow transport of signals across it and from the amplifier input to the primary amplifier input. In this situation, a single forward path may suffice, as a signal may under all circumstances be transported from the input to the primary amplifier input via that path.

In one embodiment, the compensator comprises an operational amplifier with a feedback network. Disabling of the compensator may then take place by short circuiting at least part of the feedback network. This short circuiting may be a shorting of a capacitor of the network. When capacitor is provided between the output and an input of the amplifier, a short circuiting thereof may provide the network with a frequency independent behaviour—imposing a frequency independent behaviour to the compensator or at least reducing the gain and the phase shift of the compensator at low frequencies.

This short circuiting may be obtained in a number of manners. In one situation, the feedback network comprises a diode or two anti-parallel diodes which automatically become conductive—and thus short circuiting components connected in parallel thereto—when a voltage over the diode(s) exceeds the forward voltage of the diode(s). This voltage may be derived from the primary amplifier so that if the primary amplifier clips and outputs an excessive voltage or deviates excessively from an expected voltage, the compensator will automatically be disabled.

An alternative method would be to have another circuit determine that the primary amplifier has left the first amplifier operating mode or is in the second, third or fourth amplifier operating mode and then send a predetermined signal to the compensator to which the compensator is configured to react so as to disable. This signal may, e.g. cut off the power to the compensator.

In other situations, a detection circuit may determine that the primary amplifier has left the first amplifier operating mode or is in the second, third or fourth amplifier operating mode and then send a predetermined signal to the compensator to which the compensator is configured to react so as to disable itself.

This signal may, e.g. be used to cut off the power to the active circuit of the compensator, remove the bias current from the active circuit of the compensator or short circuit or disconnect parts of the active circuit of the compensator. Alternatively short circuiting of at least a part of the feedback network of the compensator may be effected using switches, for example transistors or FETs operated as switches and controlled by the signal from the detection circuit. Alternatively, such a switch may be inserted in series with the input of the compensator and configured to be normally on (i.e. closed) but turned off when the detection circuit has determined that the primary amplifier is e.g. in the second amplifier operating mode.

A second aspect of the invention relates to an amplifier comprising an amplifier input and an amplifier according to the first aspect as well as a second control circuit comprising:
 a third control input operatively connected to the amplifier input,
 a second control output operatively connected to the amplifier input, and
 a fourth control input operatively connected to the output with a low pass filter provided between the fourth control input and the second control output.

Naturally, all the embodiments, situations and considerations made in relation to the first aspect are equally valid in relation to the second aspect.

The amplifier of the first aspect preferably is an integrating amplifier.

In this context, a low pass filter is any circuit whose frequency response exhibits a downward trend over at least a decade or over at least 20 dB. A low pass transfer function describes a circuit having a lower attenuation (or higher gain) at lower frequencies and a higher attenuation (or lower gain) at higher frequencies.

The low pass filter may be permanently active, such as if made of discrete or inactive components, or it may be configured to be disabled, such as when the primary amplifier is in its second mode of operation. Disabling may be as described above an in Applicant's co-pending application filed on even date with the title "AMPLIFIER CIRCUIT", which is hereby incorporated herein by reference in its entirety. Other solutions and embodiments may be seen in the Applicant's co-pending application titled "AN AMPLIFIER WITH A COMPENSATOR WITH A NETWORK OF AT LEAST THIRD ORDER", which is also filed on even date and hereby incorporated herein by reference and in its entirety.

A purpose of adding this low-pass filter may be first to turn an integrating amplifier into one with a wide, flat frequency response whilst at the same time increasing overall loop gain and attenuating high frequency components in the input signal. This amplifier will have a second order closed loop response which is highly desired.

A third aspect of the invention relates to an assembly of a load, a cable and an amplifier according to the second aspect, wherein:
 the cable having a first end and a second end and being connected, at the first end, to the amplifier output and, at the second end, to the load and
 the fourth control input is operatively connected to the second end of the cable.

Naturally, all embodiments, situations and considerations relating to the above aspects are equally relevant for this aspect.

The amplifier according to the second aspect is especially well suited for taking into account any influences, typically resistance or impedance, caused by the cable. Thus, providing a feedback from the far end of the cable enables the amplifier to take this influence into account.

In this respect, the cable may be an elongated element comprising one or more conductors extending from the first end to the second end.

The load may be any power consuming element, such as a loudspeaker, a motor, an actuator or the like. Such elements receive a voltage difference between (at least) two connectors or conductors. Both conductors or connectors are usually connected to the amplifier, but one suffices, if both the amplifier and the load are connected to e.g. a common voltage such as ground. Often, this other conductor or connection to a common voltage is implicit and not described for simplicity.

Then, the cable may comprise a first conductor connected to the output of the amplifier at the first end and to the load at the second end. The cable may then comprise a second conductor connected, at the second end, to the first conductor or the load (often to the same connector or conductor) and to the fourth control input at the other end.

Naturally, the cable may comprise a third conductor connected to the amplifier, such as a predetermined voltage, often ground, and to the other conductor or connector of the load so as to generate the desired voltage variation across the load between the first and third conductors.

The advantage is that by sensing the voltage directly at the load, instead of at the amplifier output, is that the cable impedance may be included in the feedback loop and the effects of this impedance are substantially reduced.

A fourth aspect of the invention relates to an assembly of a load and an amplifier according to the first aspect of the invention, the load connected to the output of the amplifier, the assembly further comprising:
 a current control input,
 sensing means for sensing current through the load and for outputting a signal relating to the sensed current and
 a difference amplifier having:
  a first input connected to the sensing means, a second input connected to the current control input, and an output operatively connected to the input of the amplifier, the difference amplifier being configured to subtract a signal received on the second input from a signal received on the first input.

Naturally, all embodiments, situations and considerations relating to the above aspects are equally relevant for this aspect.

In this context, the current control input may be the input of the amplifier proper. Thus, this input will receive e.g. an audio signal to be amplified and fed to the load which will then typically be a loudspeaker.

Alternatively, the current control input may receive a signal which is amplified and fed to an actuator being the load, where the signal fed to the current control input defines the desired operation of the actuator.

As described above, the load is usually fed via two conductors to the amplifier of which one is connected to the amplifier output, such as the output of the amplifier. The other conductor may simply be connected to a fixed voltage. The amplifier may then be connected to the same voltage to provide the desired power supply to the load.

The current sensor may be provided at any position along the feeding conductors and the load.

The purpose may be to construct an amplifier with a high output impedance i.e. one where the input signal does not control the voltage at the output or across the load but the current flowing through the load.

BRIEF DESCRIPTION OF THE DRAWINGS

In the following, preferred embodiments of the invention are illustrated with reference to the drawing, wherein:

FIG. 5 illustrates a circuit implementation of the summing node 1, third feedback filter 12 and the first forward filter 2, where forward filter 2 is a first order lowpass filter.

FIG. 6 illustrates a circuit implementation of the summing node 1, third feedback filter 12 and the first forward filter 2, where forward filter 2 is an integrator.

FIG. 7 illustrates a circuit implementation of the summing node 1, third feedback filter 12 and the first forward filter 2, where forward filter 2 is a second order lowpass filter.

FIG. 8 illustrates a circuit implementation of summing node 4, forward filter 3, second feedback filter 11 and compensator 5, where compensator 5 is an op amp with a capacitor used as compensation network 51 in parallel with a diode network 52 connected between the output and the inverting input thus making compensator 5 a saturated integrator and where forward filter 3 is a resistor and second feedback filter 11 is a high-pass filter.

FIG. 9 illustrates another network that may also be used as compensation network 51, making the compensator a function having two DC poles and one real zero.

FIG. 10 illustrates another network that may also be used as compensation network 51, making the compensator a function having one real zero and two complex poles of which only the magnitude can be freely chosen.

FIG. 11 illustrates another network that may also be used as compensation network 51, making the compensator a function having one real zero and two complex poles that can be freely chosen.

FIG. 12 illustrates another network that may also be used as compensation network 51, making the compensator a function having two real zeros and one DC pole and two complex poles of which only the magnitude can be freely chosen.

FIG. 13 illustrates another network that may also be used as compensation network 51, making the compensator a function having two real zeros and one DC pole and two complex poles which can be freely chosen.

FIG. 14 illustrates another network that may also be used as compensation network 51, making the compensator a function having three real zeros and two pairs of complex poles of which only the magnitude can be freely chosen.

FIG. 16 illustrates another network that may be used as feedback network 52 to effect saturation of the compensator.

FIG. 17 illustrates a circuit implementation of compensator 5 where saturation is implicitly applied by letting the operational amplifier clip against its supply rails.

FIG. 18 illustrates a circuit implementation of compensator 5a for use in the embodiment of FIG. 2, where no means of saturation is provided but a field effect transistor is connected across compensation network 51 in order to re-set the compensator.

FIG. 19 illustrates a circuit implementation of compensator 5a for use in the embodiment of FIG. 2, where a switch is placed in series with the integrator to hold the integration but not reset the integrator.

FIG. 20 illustrates a fully differential circuit implementation of compensator 5a for use in the embodiment of FIG. 2 having three poles (of which two a resonant pair) and two zeros, executed using three op amps, and with reset switches across every capacitor.

FIG. 21 illustrates a circuit implementation of forward filter 3 and second feedback filter 11 where forward filter 3 is a first order low pass filter.

FIG. 22 illustrates a circuit implementation of the summing nodes 6 and 7 and the first feedback filter 10 where first feedback filter 10 is a high-pass filter.

FIG. 23 illustrates a circuit implementation of the summing nodes 6 and 7 and the first feedback filter 10 where first feedback filter 10 is a high-shelf filter.

FIG. 24 illustrates a simplified circuit of a linear amplifier configured as a voltage follower, indicating where improved versions of compensation network 51 can be substituted.

FIG. 27 illustrates a prior art amplifier with approximate equivalent functions marked, namely a first order high pass filter as the first feedback filter 10 and a first order low pass filter as the first forward filter 2.

FIG. 28 illustrates an amplifier according to the invention, showing the use of a second or higher order highpass filter in the first order feedback filter.

DETAILED DESCRIPTION OF VARIOUS EMBODIMENTS

Figure 1:
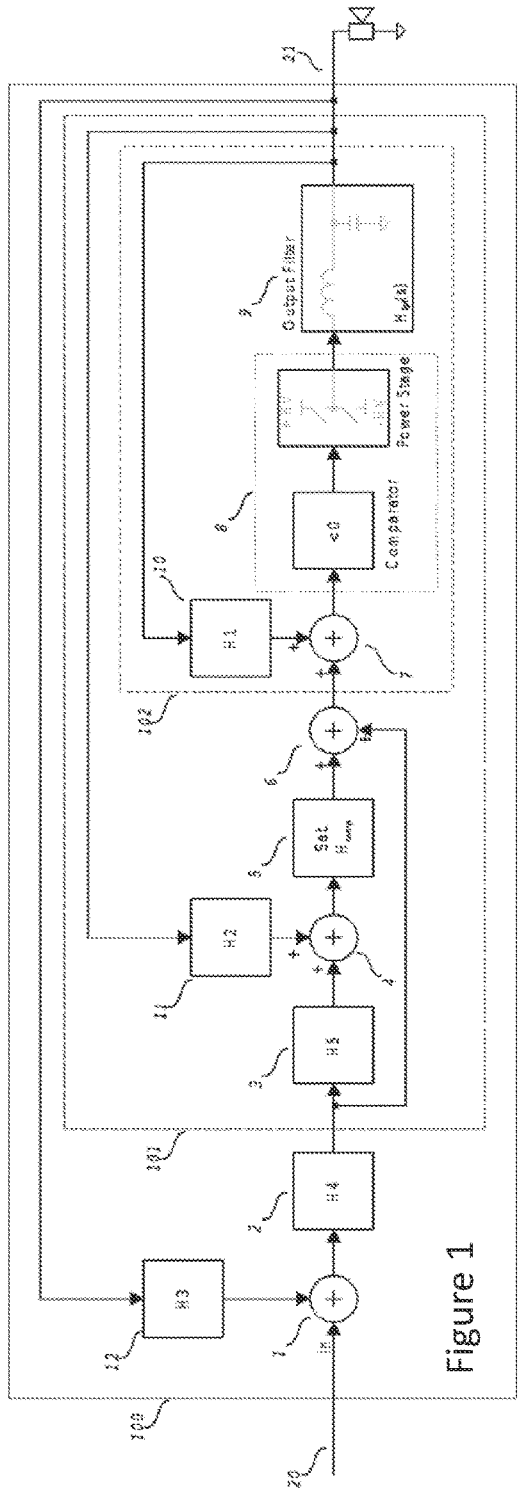
FIG. 1 illustrates a first embodiment of a class D power amplifier according to the invention.

In FIG. 1, an amplifier 100 is illustrated having an input 20, an output 21, a gain stage (boxes 8 and 9), four summing nodes, 1, 4, 6, 7, a first feedback filter 10, a second feedback filter 11, a third feedback filter 12, a first forward filter 2, a second forward filter 3 and a compensator 5.

A primary amplifier is indicated as box 102 and a secondary amplifier as box 101.

A forward path is defined between input 20 and the input into the primary amplifier 101, and multiple feedback paths are illustrated, all between the output 21 and a summing node.

An internal feedback path is defined between the output 21 and the summing node 7, and an internal feedback loop is defined from the output 21, through filter 10, summing node 7, amplifier gain stage 8 and the filter 9.

Through input 20 an audio signal is fed into summing node 1. Output 21 is connected to summing node 1 through feedback filter 12. In the preferred embodiment, feedback filter 12 is a resistor as shown in FIG. 5 but it could also contain a filter to allow further shaping of the frequency response of the amplifier 100. The output of summing node 1 is fed into a forward filter 2. In the preferred embodiment forward filter 2 is a first order low-pass filter as shown in FIG. 5, with a corner frequency above the audio band. The output of forward filter 2 is connected both to summing node 6 and to summing node 4 through forward filter 3. Summing node 4 also receives the signal of output 21 through feedback filter 11. Summing node 4 feeds the compensator 5. The compensator 5 feeds summing node 6. The compensator is arranged so that it is disabled when the amplifier clips. The forward path has parallel portions where one portion comprises filter 3, summing node 4 and filter 5 and where the other portion is the direct connection from the input of filter 3 to summing node 6.

A feedback path is defined from output 21 through filter 11 to summing node 4. This feedback path forms part of a feedback loop comprising also the compensator 5, summing node 6 and the primary amplifier 102. Thus, the feedback loop comprises a control circuit formed by filter 11 and the compensator 5.

In this embodiment, the compensator comprises an operational amplifier, 50, which is a compensator gain stage, with a capacitive compensation network 51 connected between the output and the inverting input of the operational amplifier. This is illustrated in FIG. 8. When designing filter circuits employing feedback networks around op amps it is common practice to provide a duplicate of these feedback network between ground and the non-inverting input of the op amp in order to obtain a circuit with a differential input. Among other advantages this allows for free choice of inverting or non-inverting operation. For clarity however, such duplicate feedback networks are not shown in the drawings and any inversions necessary to restore correct polarity are implied.

The simplest such capacitive feedback network is simply a capacitor as in FIG. 8. The resulting circuit is an integrator i.e. a circuit whose gain is inversely proportional to frequency. This is also called a first-order filter or a one-pole filter, the "pole" being a (real or complex) frequency where gain is infinite, and where the "order" is the number of poles. In a simple integrator the pole is at (or in practice very close to) 0 Hz. The ratio of Ifb and Vcomp is inversely proportional to the compensator gain which is desired to be high in the desired operating frequency range. For the purposes of this disclosure, a capacitive network is understood to be a circuit that generates a feedback current Ifb whose magnitude relative to the op amp output voltage Vcomp increases with frequency, at least in the range between the operating bandwidth of the amplifier and half the switching frequency. As an example the ratio between Ifb and Vcomp may increase tenfold between 20 kHz and 200 kHz. As another example the ratio between Ifb and Vout may increase tenfold between 80 kHz and 800 kHz. Moreover, the Ifb/Vcomp ratio is low in the described amplifier operating range to secure a high compensator gain.

Figure 15:
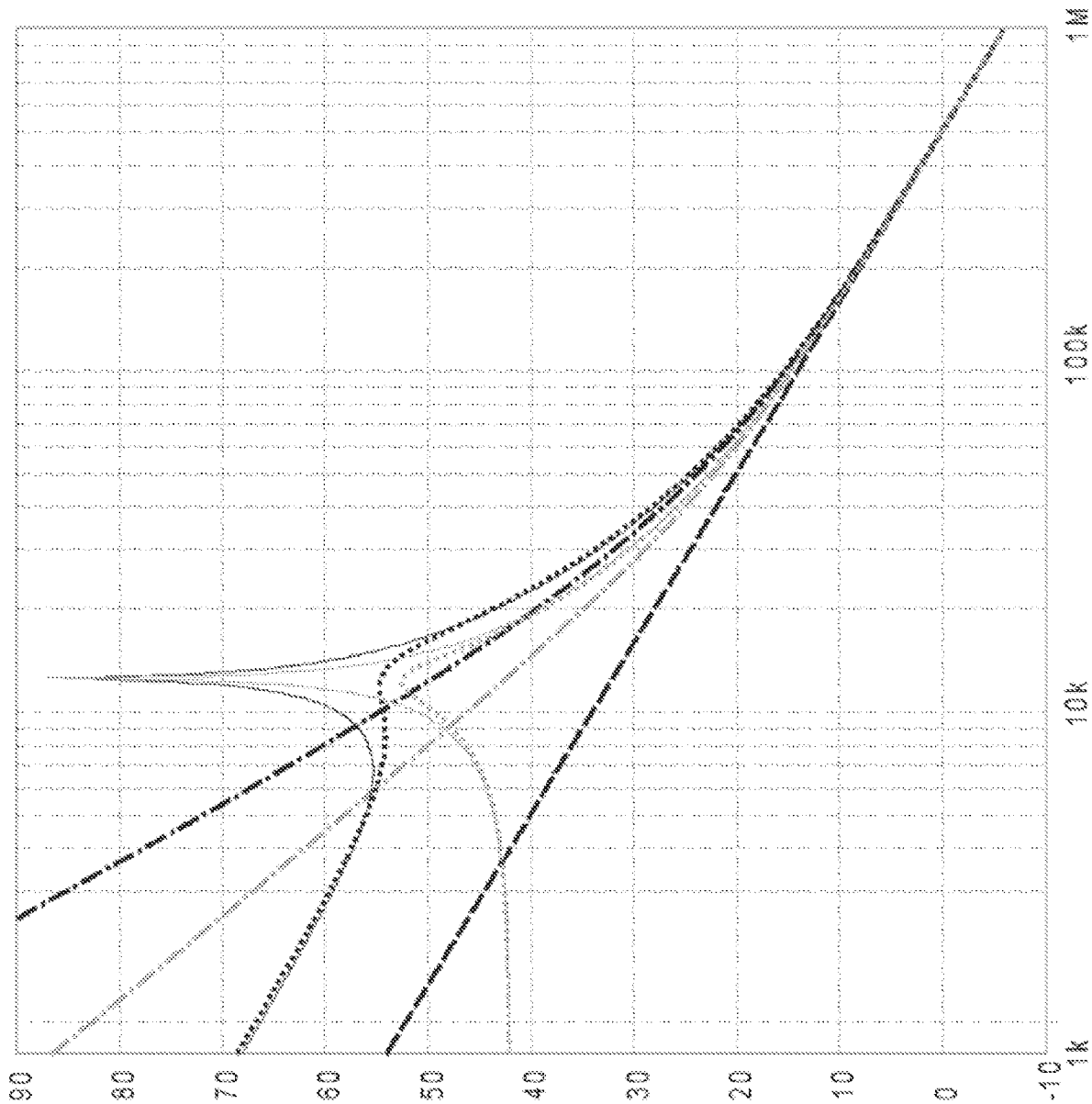
FIG. 15 illustrates typical curves of the gain obtained by a circuit like that of FIG. 8 with the compensation network 51 of FIG. 8 (dashed, black), FIG. 9 (dashdot, grey), FIG. 10 (dotted, grey), FIG. 11 (solid, grey), FIG. 12 (dotted, black), and FIG. 13 (solid, black) used.

In FIG. 9, a second order response is illustrated. As an example of the type of response obtained is shown in the grey dashdot line of the graph in FIG. 15. At low frequencies, gain is inversely proportional to the square of frequency as evidenced by a downward slope of (40 dB/decade). At high frequencies the response transitions to a first order (20 dB/decade) slope. This type of behaviour is highly desirable for compensators. The filter is designed such that the transition to a first order slope happens before the point where loop gain becomes 1, therefore reducing the phase shift to a sufficiently low value to permit stable operation. At the same time, the faster slope at low frequencies permits higher loop gain at low frequencies than a simple first order circuit would. The refinements in FIG. 10 and FIG. 11 serve to move the frequency, where gain is highest, to a higher frequency, at the expense of loop gain at DC (dotted grey and solid grey in FIG. 15).

The low-frequency loop gain may be further increased (i.e. increase the order) without using additional amplification stages. Hitherto, compensators of orders 3 and higher have only been implemented using one amplification stage per order as illustrated in FIG. 20.

In FIG. 8, the inverting input terminal of op amp 50 is operated as a virtual short and the compensation network 51 is a capacitor that acts as a differentiator, its output current Ifb being the derivative of Vcomp. Otherwise put, Vcomp is the integral of the current Ifb. The network of FIG. 9 acts as a differentiator cascaded with a first order high-pass filter. This network can be extended by adding additional high-pass sections. Adding one more high-pass section results in a response like that shown in the black dash-dot line in FIG. 15. A resistor bridging two of the three capacitors (as shown in FIG. 12) will again move two poles up in frequency as shown in the dotted black line in FIG. 15. FIG. 13 shows a method of increasing the Q of the two poles which does not require a three-component parallel T network as was needed to produce the same effect in the two-pole case of FIG. 11. Finally, FIG. 14 shows that the method can be extended to an arbitrary number of poles by cascading further high-pass sections (optionally with parallel networks to move the poles up in frequency).

This insight is not only applicable to control circuits for class D amplifiers. FIG. 24 shows the basic circuit of a standard operational amplifier (actual op amps may use bipolar transistors, j-FETs, MOSFETs or similar devices, or a mixture, and may contain additional bias, cascode or protection circuits). Compensation network 51, here a capacitor, takes the position of "compensation capacitor". Here too, such a network improves audio fidelity.

In one embodiment of the invention, it is noted that in the context of the primary amplifier 102, the first feedback filter 10 fulfils a function similar to the one fulfilled by the compensation network 51 in the context of the compensator 5. That is to say, the gain of the compensator is approximately inversely proportional to the gain of compensation network 51. If the compensation network 51 is a capacitor, the compensator 5 will behave like an integrator. If the compensation network 51 is a higher order differentiating network like those shown in FIG. 9 and following until FIG. 14, the compensator will act like higher order integrators. Likewise, the gain of the primary amplifier 102 is approximately inversely proportional to the gain of the feedback filter 10. Substituting a higher order differentiating network for the capacitor in first feedback filter 10 will therefore increase the gain of the primary amplifier 102. Signal cancellation is again obtained by providing a similar network for the known single capacitor in second feedback filter 11.

FIG. 27 illustrates a known, simple circuit whose performance is acceptable in many audio applications. In terms of the elements named in the present description, it can be broken down as a forward filter 2, a first feedback network 10, a gain stage 8 and an output filter 9, where summing nodes 1 and 7 are implemented as circuit junctions. Modifying the first feedback filter 10 by substituting a higher order differentiating network for the capacitor improves loop gain in such a circuit in an inexpensive manner.

In the preferred embodiment a second feedback network 52 is connected to provide saturation i.e. to prevent the voltage across the capacitive feedback network 51 from becoming greater than a pre-set limit. This second feedback network may be as simple as a pair of antiparallel diodes as shown in FIG. 8, or may be a more sophisticated circuit such as the one from FIG. 16. In yet another embodiment op amp 50 is simply powered from supply voltages chosen so that the output Vcomp of op amp 50 is naturally saturated just outside the normal operating range (FIG. 17).

It can be verified experimentally if signal cancellation and saturation are employed together to the effect that the compensator is arranged to disable its operation when the primary amplifier clips. First an audio signal is applied to input 20 with a sufficient amplitude to cause severe clipping of the primary amplifier 102. As the input signal, a sine wave, which continually sweeps between 20 Hz and 20 kHz, is used. The peak-to-peak value Vclip of the output signal 21 is recorded. During this test, saturation of the compensator 50 should be observed (observation 1). Next, the level of the audio signal is reduced until the peak-to-peak value of output signal 21 is 70% of Vclip. Now, no saturation of the compensator 50 should be observed (observation 2). Next, the gain of the first feedback filter 10 is changed by 10% at least in the range of DC to 20 kHz. Saturation of the compensator 50 should again be observed, even though the primary amplifier 102 is far from clipping (observation 3). If observations 1, 2 and 3 are all true, the compensator is arranged to disable its operation when the primary amplifier clips.

An alternative procedure for establishing if signal cancellation and saturation are employed together to the effect that the compensator is arranged to disable its operation when the primary amplifier clips, is to look for a drastic change in distortion performance when the gain of first feedback filter 10 is changed. First, establish the clipping level of the amplifier by applying a sinusoidal audio signal to the input 20 and adjusting the level until total harmonic distortion measures 10%. Then, reduce the signal level by 40% and measure distortion. Next, change the gain of the first feedback filter by 10% and measure distortion again. If the second distortion figure is at least twice the first distortion figure, the compensator is arranged to disable its operation when the primary amplifier clips. The test could be done at 1 kHz and 6 kHz.

Figure 2:
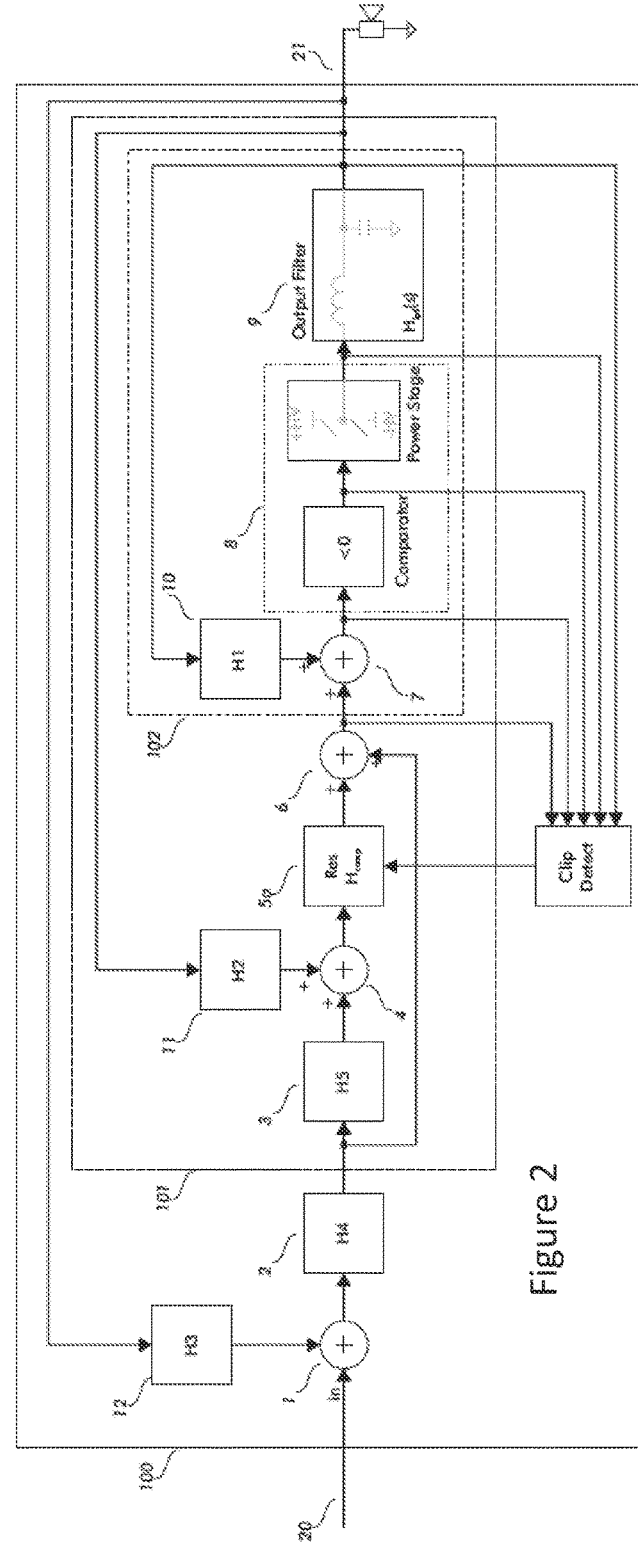
FIG. 2 illustrates a second embodiment of a class D power amplifier according to the invention

In the second embodiment (FIG. 2), a circuit is added that detects clipping of the primary amplifier. Many ways of detecting clipping exist. One method is monitoring the output of summing node 7 with a window comparator. During normal operation, the output of summing node 7 will remain within certain limits as it needs to cross zero to make the output stage change state. When the primary amplifier clips, the output of summing node 7 will grow much larger. This allows easy discrimination of normal operation or clipping. Another method is to time the comparator output. If it stays in high or low for longer than a predetermined maximum, the primary amplifier is deemed to be clipping. Further methods involve comparing the input or output signal to pre-set limits beyond which the primary amplifier is deemed to be clipping.

The output of the clipping detector is then used to control switches 53 (shown in FIG. 18) that short-circuit (i.e. reset) the capacitive feedback network 51. Such switches may be implemented using field effect transistors. A variant using a single capacitor as the feedback network and a field effect transistor acting as reset switch is shown in FIG. 18.

Alternatively, a switch may be arranged to disable further integration. FIG. 19 shows an implementation of a compensator where a switch is arranged to disconnect the input of the compensator when clipping of the primary amplifier is detected, and to reconnect the input of the compensator when the primary amplifier returns to normal operation.

The compensator does not need to be constructed using one op amp and neither does it need to have only one feedback network. Functionally equivalent circuits can be made e.g. using differential feedback networks, differential op amps or multiple op amps. An implementation is shown in FIG. 20 of a third order compensator constructed using three differential op amps and using field effect transistors to reset the individual integrating stages. It will be clear that this implementation is shown to indicate multiple variations at once, and that many useful combinations can be found.

The output of summing node 6 feeds the primary amplifier 102. This amplifier may be a class A, AB, B or D amplifier. In the case that it is a class D amplifier, it may be self-oscillating or oscillator driven. A self-oscillating implementation may comprise a class D gain stage 8, an output filter 9 and feedback filter 10. Gain stage 8 comprises a switching power stage controlled by a comparator (or zero-crossing detector). Gain stage 8 will connect its output either to a positive or a negative power supply rail depending on the sign of the input signal applied to the comparator. Constructed in this manner, primary amplifier 102 operates as a self-oscillating amplifier. If a periodic reference signal such as a triangle wave is connected to the noninverting terminal of Gain stage 8, the amplifier is no longer self-oscillating. Its operating frequency and gain will instead be determined by the frequency, shape and amplitude of the reference waveform. In prior art amplifiers, feedback filter 10 was designed so that the frequency response of the primary amplifier 102 was flat enough for audio use. This does not have to be the case in the present invention where feedback filter 10 may have negligible gain at DC. In the preferred embodiment, feedback filter 10 consists of only a resistor and a capacitor in series (FIG. 22). Consequently the frequency response of primary amplifier 102 approximates a low-pass filter with a large DC gain and a low corner frequency. Over most of its useable bandwidth it has a 20 dB/decade downward slope. For practical purposes primary amplifier 102 behaves like an integrator.

In the preferred embodiment, forward filter 3 has a constant gain (e.g. is a resistor) and feedback filter 11 is an exact copy of feedback filter 10 with a resistor in parallel to take into account the fact that the DC gain of the primary amplifier is not infinite, thereby improving signal cancellation. This shows that it is advantageous to have separate circuits for feedback filters 10 and 11. This arrangement is shown in FIG. 1. The frequency response of the secondary amplifier 101 closely matches the frequency response of the primary amplifier 102 alone. It may be advantageous to numerically optimize forward filter 3 and feedback filter 11 together to obtain further improved cancellation of the audio input signal at the output of the saturated compensator 5. FIG. 21 shows an example where forward filter 3 is a first order low pass filter.

It is preferred to obtain a closed loop frequency response approximating a second or higher order low-pass filter with the possibility of attaining a Bessel, Butterworth or Chebyshev response or anything in-between. A way of constructing a second order low pass filter with a resonant over (having a Q factor over 0.5) is placing two first-order low-pass filters inside a common feedback loop. To obtain a second order low-pass frequency response from amplifier 100, secondary amplifier 101 and forward filter 2 are used as the constituent parts of such a low-pass filter. The feedback loop is closed through feedback filter 12 and summing node 1. In the preferred embodiment the secondary amplifier 101 has a large DC gain but a very low corner frequency. FIG. 22 shows an implementation of first feedback filter 10 that would effect such a response. Generally, to obtain such a characteristic for the secondary amplifier 101, first feedback filter 10 should be configured to have very low gain at DC and high gain at high frequencies (e.g. the switching frequency, 200 kHz, 100 kHz). If first feedback filter 10 has nonzero gain at DC, the frequency at which its gain has increased by 3 dB above its DC gain should be low (e.g. below 20 kHz, e.g. below 2 kHz). If first feedback filter 10 is a first order high pass filter, an approximately second order frequency response may be obtained for amplifier 100 by enclosing secondary amplifier 101 in a feedback loop with a forward filter 2 if forward filter 2 is configured as a first-order low-pass filter. FIG. 5 shows an implementation of such a forward filter 2. Any desired corner frequency and Q factor for the frequency response of amplifier 100 can be obtained by varying the gain and the corner frequency of forward filter 2.

It will be clear to the person skilled in the art that the same frequency response for amplifier 100 is available with different choices of feedback filter 10 and forward filter 2. For example FIG. 23 shows an implementation of feedback filter 10 that permits the secondary amplifier to have a low DC gain but conversely a high corner frequency. Subsequently configuring forward filter 2 as an integrator allows the Q factor of the frequency response of amplifier 100 to be chosen freely. An implementation configuring forward filter 2 as an integrator is shown in FIG. 17. It is an objective of the invention that the additional signal processing (here forward filter 2) does not suffer from integrating windup. Although it would be more in line with conventional amplifier design strategy to configure forward filter 2 as an integrator, clipping of the primary amplifier would cause the output of forward filter 2 to keep growing so long as clipping persists, causing integrating windup. Therefore, it is preferred to configure forward filter 2 as a low-pass filter and to configure the primary amplifier to have high DC gain and a low corner frequency (e.g. below 20 kHz, e.g. 1 kHz).

It is desired that the additional signal processing provides low-pass filtering between the amplifier input and the comparator. Since forward filter 2 is a low-pass filter or an integrator, this is obtained.

Higher order low-pass behaviour can be obtained by increasing the order of the forward filter 2. This can be done, for example, as shown in FIG. 7. This further improves the attenuation of high-frequency components in the input signal that reach the comparator.

Figure 25:
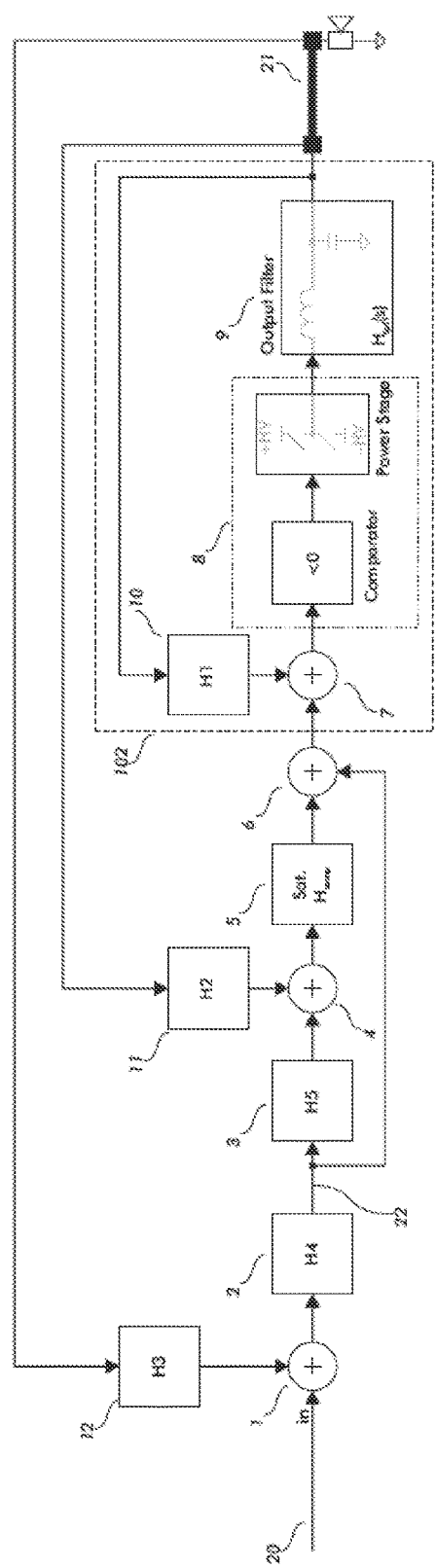
FIG. 25 illustrates an assembly according to the present invention, of a secondary amplifier 101, forward filter 2, third feedback filter 12, a cable and a load where the input signal to the third feedback filter 12 is connected at the end of the cable to which the load is attached.
Figure 26:
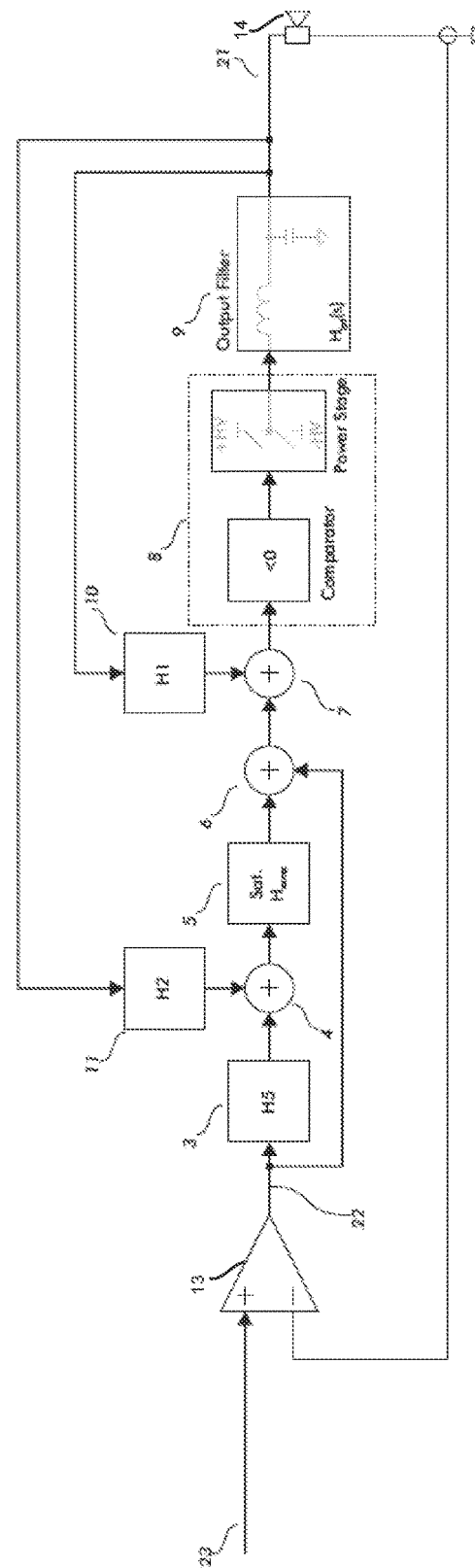
FIG. 26 illustrates an assembly according to the present invention, of a secondary amplifier 101, which is configured as an integrating amplifier, a difference amplifier 13, a load and a current sensor 14, where the integrating amplifier is configured to respond to the difference between the input signal and the output signal of the current sensor.

It is preferred that the amplifier be more amenable to remote sensing. As illustrated in FIG. 1 thru FIG. 4, the input of the third feedback filter 12 is connected to the load independently of the inputs of second feedback filter 11 and first feedback filter 10. This allows the input of the third feedback filter 12 to be connected at the far end of the cable connecting the amplifier and the loudspeaker load, whereas feedback filters 11 and 10 may be connected at the near end. This arrangement is shown in FIG. 25. This is possible because forward filter 2 is a low pass filter or an integrator, making it insensitive to high frequency components that may be present or missing at the far end of the cable. Also, forward filter 2 does not rely on signal cancellation to prevent integrator windup, so the gain error introduced by the resistance of the cable is of no consequence. By contrast, connecting the second feedback filter 11 at the far end will result in the output signal of the compensator becoming very large.

By looking at the remote sensing feedback arrangement of FIG. 25, clearly, if the secondary amplifier 101 is configured to act as an integrator, it is in fact operating as a power op amp. In one embodiment, the secondary amplifier 101 is configured as an integrator, so it can be used in many applications requiring the use of a power op amp. FIG. 28 shows an arrangement of secondary amplifier 101 used as a power op amp in conjunction with a current sensor to act as a controlled current source. The current sensor may be a resistor, a current sense transformer or a hall sensor. Its output is typically a voltage proportional to the load current. This voltage is subtracted from the input signal and applied to the input of primary amplifier 102. The subtraction may be done using a simple fixed gain difference amplifier, but additional filtering may be provided also.

Figure 3:
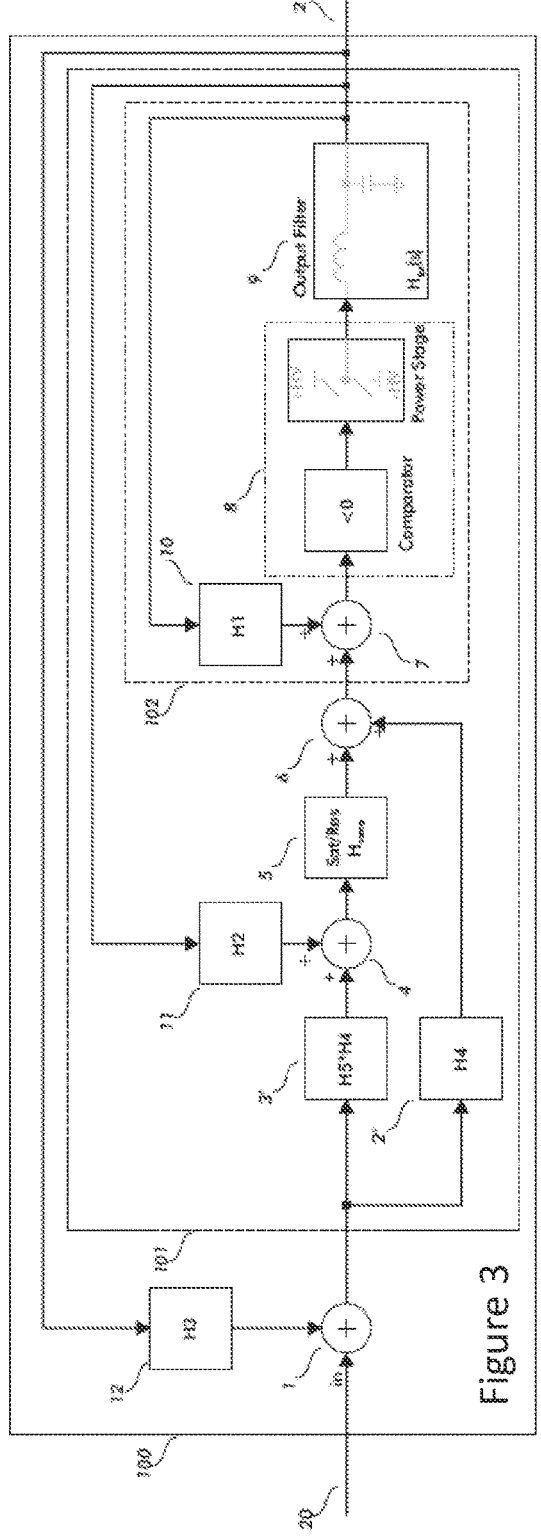
FIG. 3 illustrates a third embodiment of a class D power amplifier according to the invention

In FIG. 3 an alternative embodiment is shown. It is obtained from FIG. 1 by simple block diagram manipulation. Filter 3' now combines the transfer functions of filters 2 and 3, while filter 2' is identical to filter 2 but is now only inserted in the parallel connection between summing nodes 1 and 6. This clearly illustrates that it is possible to deviate from the exact structure of FIG. 1 without in any way changing the operation of the circuit. This method may be advantageous by allowing separate tweaks to the two versions of H4 (previously filter 2), further improving the accuracy of signal cancellation.

Figure 4:
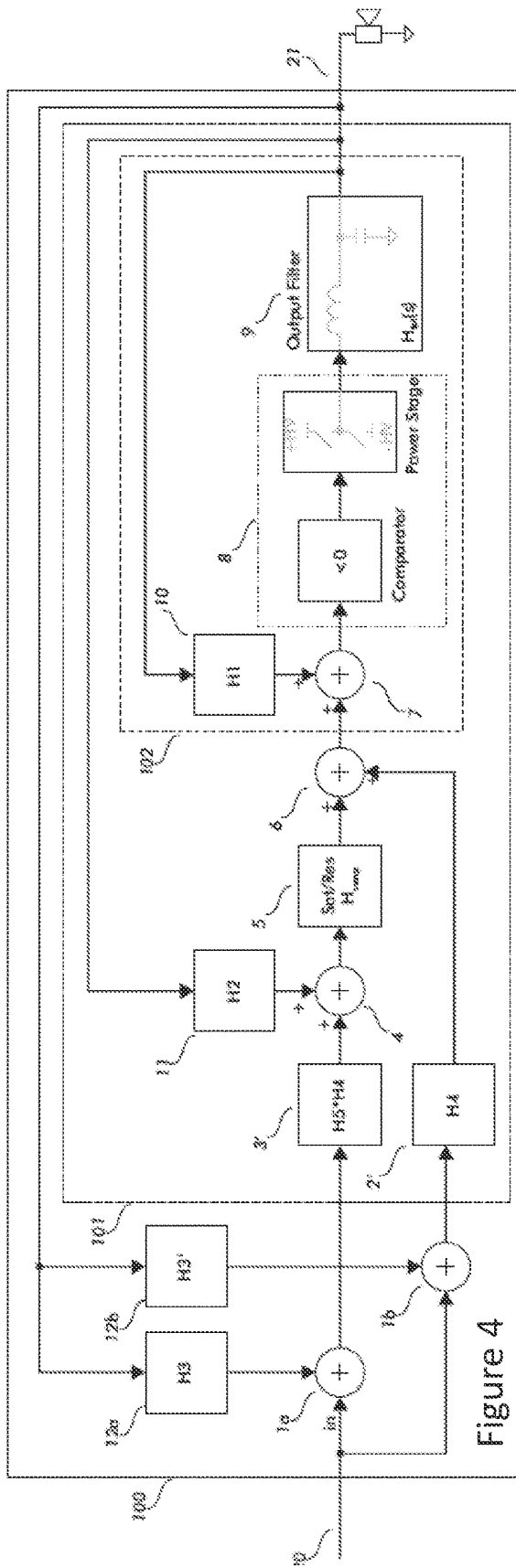
FIG. 4 illustrates a fourth embodiment of a class D power amplifier according to the invention.

FIG. 4 shows an implementation where summing node 1 is duplicated along with its input and feedback filter 12 which now appears twice as 12a and 12b. Here too, a potential benefit may be expected in improving signal cancellation, as well as allowing different choices for the amplification stages used in 2' and 3'.

It will be plain to the person skilled in the art that such rearranging of functional blocks can yield further embodiments that nevertheless do not deviate from the teachings of this invention. When the first path comprises at least a compensator that is disabled when the primary amplifier clips, a second path may be provided which does not include that compensator but which comprises at least a first order low-pass filter.

It follows that the path that does not comprise the compensator can be characterised by taking the steps of 1) disabling the primary amplifier, 2) disabling the compensator, 3) applying a sinusoidal stimulus to the input 20 and 4) measuring the signal level found at the input of the primary amplifier 102. This measurement is first done at a first frequency which is twice the corner frequency of the amplifier 100, yielding a first signal level, and repeated at a second frequency which is four times the first frequency, yielding a second signal level. If the second level is less than one-third of the first level, the second path behaves like at least a first order low pass filter.

It may be impractical to isolate the input of the primary amplifier for this purpose, because summing nodes are often implemented as circuit junctions. In that case, an alternative test method may be applied in which the amplifier operates normally. Since the use of a first-order filter as the forward filter 2 will result in amplifier 100 operating as a second-order low-pass filter, this characteristic can be tested directly. To this end, a sinusoidal stimulus is connected to the input 20 and the level is measured at the output 21. This test is again done at two frequencies. First at a first frequency which is twice the corner frequency of the amplifier 100, yielding a first signal level, secondly at a second frequency which is twice times the first frequency, yielding a second signal level. If the second level is less than one-third of the first level, the second path behaves like at least a first order low pass filter.

The invention claimed is:

1. An amplifier comprising:
an input,
an output,
a primary amplifier having a primary amplifier input, a primary amplifier output, a comparator, a switching power stage controlled by the comparator, and a feedback network connected between the output and an input of the comparator, the feedback network forming at least substantially a high pass filter, and the primary amplifier being configured to have a frequency response at least substantially as that of an integrator, and a low pass filter connected between the switching power stage and the primary amplifier output, and
a first control circuit comprising:
a first control input operatively connected to the input,
a second control input operatively connected to the primary amplifier output,
a control output operatively connected to the primary amplifier input, the first control input, and the second control input,
a first, high pass, filter which is of at least first order and provided between the second control input and the control output,
a second, low pass, filter of at least first order provided in a path common to the path between the first control input and the control output and the path between the second control input and the control output.

2. The amplifier according to claim 1, wherein the first control circuit has:
a first transfer function from the second control input to the control output, and
a second transfer function from the first control input to the control output,
where a ratio between the first transfer function and the second transfer function at least substantially corresponds to the transfer function of an integrator over at least a frequency decade.

3. The amplifier according to claim 1, wherein the primary amplifier is configured to operate in one of at least a first and a second operating mode, and
wherein the first control circuit comprises a compensator that is configured to have its operation disabled when the primary amplifier is operating in the second operating mode.

4. The amplifier according to claim 3, wherein the compensator comprises an amplifier with a feedback network, the compensator being configured to be disabled by short circuiting at least part of the feedback network.

5. The amplifier according to claim 3, wherein, in the first operating mode, the primary amplifier operates in a normal operating mode.

6. The amplifier according to claim 5, wherein, in the second operating mode, the primary amplifier operates in a clipping mode.

7. The amplifier according to claim 5, wherein, in the second operating mode, the primary amplifier outputs on the primary amplifier output a signal having a negligible response to changes in signals received on the primary amplifier input.

8. The amplifier according to claim 1, wherein a filter of at least second order, or a portion thereof, is between the first control input and the control output.

9. The amplifier comprising an amplifier input and an amplifier according to claim 1, comprising a second control circuit comprising:
a third control input operatively connected to the amplifier input,
a second control output operatively connected to the third control input and the input,
a fourth control input operatively connected to the output and the second control output, and
a low pass filter provided between the fourth control input and the second control output.

10. An assembly of a load, a cable and an amplifier according to claim 9, wherein:
the cable is connected, at one end, to the output and, at the other end, to the load and
the fourth control input is operatively connected to the other end of the cable.

11. The assembly of a load and an amplifier according to claim 1, the load connected to the output of the amplifier, the assembly further comprising:
a current control input,
means of sensing current through the load configured to output information relating to the sensed current and
a difference amplifier configured to subtract a signal received on the current control input from a value of the information, where the output of the difference amplifier is connected to the input of the amplifier.

* * * * *